United States Patent
Konishi et al.

(10) Patent No.: US 6,441,456 B1
(45) Date of Patent: *Aug. 27, 2002

(54) SEMICONDUCTOR DEVICE AND A PROCESS FOR MANUFACTURING THE SAME

(75) Inventors: Akito Konishi; Akio Kawamura, both of Fukuyama (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/429,485

(22) Filed: Oct. 29, 1999

(30) Foreign Application Priority Data

Nov. 16, 1998 (JP) ............................................. 10-325252

(51) Int. Cl.⁷ ............................................... H01L 29/00
(52) U.S. Cl. ....................................... 257/509; 257/545
(58) Field of Search ................................ 257/401, 349, 257/509, 545, 506, 510; 438/424, 414

(56) References Cited

U.S. PATENT DOCUMENTS 5,635,744 A * 6/1997 Hidaka et al. ............... 257/349

FOREIGN PATENT DOCUMENTS

EP 0844660 A1 * 5/1998

OTHER PUBLICATIONS

Patent Abstracts of Japan, Application No. Hei 9–181159, Jul. 1997.

* cited by examiner

*Primary Examiner*—Steven Loke
*Assistant Examiner*—Thien F. Tran
(74) *Attorney, Agent, or Firm*—Nixon & Vanderhye P.C.

(57) ABSTRACT

A semiconductor device comprises:a semiconductor substrate; a plurality of active regions for forming semiconductor elements, the active regions being formed on the semiconductor substrate; a device isolation region for separating the plural active regions from each other, the device isolation region including a trench region filled with an insulating film and a pseudo active region formed adjacent to the trench region; a wiring layer formed above the semiconductor substrate; and a pseudo conductive film formed on the device isolation region, wherein, if the pseudo conductive film is partially or entirely located under the wiring layer, the pseudo conductive film is formed only on the trench region.

11 Claims, 5 Drawing Sheets

SEMICONDUCTOR DEVICE AND A PROCESS FOR MANUFACTURING THE SAME

CROSS-REFERENCE TO RELATED APPLICATION

This application is related to Japanese application No. HEI 10(1998)-325252 filed on Nov. 16, 1998, whose priority is claimed under 35 USC §119, the disclosure of which is incorporated by reference in its entirety.

BACKGROUND OF THE INVENTION

1. Field of the Invention

The present invention relates to a semiconductor device and a process for manufacturing the same. More particularly, the invention relates to a process for forming a device isolation region in an integrated circuit device.

2. Description of Related Art

With high integration of integrated circuit devices, miniaturization of device isolation regions as well as devices themselves is in progress. Recently, device isolation techniques using trenches are under development in place of conventionally utilized LOCOS methos.

In the trench isolation techniques, a trench is formed on the surface of a silicon substrate, an insulating film is formed on the silicon substrate including the trench and the insulating film is polished by a chemical mechanical polishing (CMP) method or the like, thereby to flatten the surface with the insulating film buried in the trench.

However, such techniques have a so-called dishing problem that, in the case where an insulating film buried in a wide trench is polished, the insulating film is polished faster in the central portion of the trench and the insulating film becomes thin there.

There is also a so-called erosion problem that, in an active region surrounded by wide trenches (of several μm width, for example), the polishing of the active region progresses excessively and therefore the surface of the silicon substrate is polished.

To cope with these problems, for example, Japanese Unexamined Patent Publication No. HEI 9(1997)-181159 proposes a method for avoiding dishing and erosion about trenches by forming a dummy pattern of regularly repeated trenches.

This method is described with reference to FIGS. 5(a) to 5(f).

Figure 5:
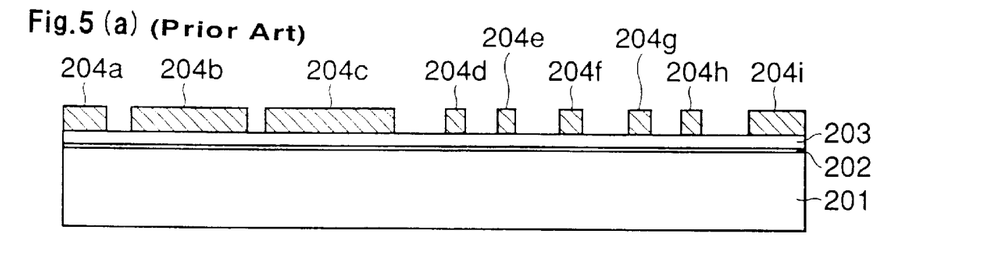
FIGS. 5(a) to 5(f) are schematic plan views of a major portion illustrating the conventional process for manufacturing a semiconductor device.

First, as shown in FIG. 5(a), a pad oxide film 202 is formed on a silicon substrate 201 by a thermal oxidization method and a silicon nitride film 203 is formed by a reduced-pressure CVD method. Subsequently, a pattern of resist films 204a to 204i is formed by a photolithography process using a mask which defines an active region.

Subsequently, as shown in FIG. 5(b), the silicon nitride film 203 and the pad oxide film 202 are selectively etched sequentially using the resist pattern 204a to 204i as an etching mask. Further, the silicon substrate is etched anisotropically to form trenches 205a to 205h having a depth of about 0.3 μm to about 0.6 μm. Thereafter, the resist pattern 204a to 204i is removed by ashing. At this time, narrow device isolation regions such as 205a and 205b are each composed only of a single narrow trench, while wide device isolation regions, 206a and 206b, are composed of trenches 205c, 205d and 205e and pseudo active regions 204d and 204e, and of trenches 205f, 205g and 205h and pseudo active regions 204g and 204h, respectively.

Subsequently, a silicon oxide film 207 is formed on the resulting silicon substrate 201 by a CVD method and polished by a CMP method to expose the surface of the silicon nitride film 203. Then the silicon nitride film 203 and the pad oxide film 202 are removed with a heated phosphoric acid solution and a diluted hydrofluoric acid solution, respectively. Thereafter, impurities are implanted for forming a well (not shown). Further, as shown in FIG. 5(c), the surface of the resulting silicon substrate 201 is oxidized to form a gate oxide film 208.

Thereafter, as shown in FIG. 5(d), a gate electrode 209, source/drain regions 211 and an interconnect 210 are formed by conventional techniques. The interconnect 210 is formed on the trench 205d sandwiched by the pseudo active regions 204d and 204e, and the width thereof is smaller than that of the trench 205d.

Next, as shown in FIG. 5(e), a resist used as a mask (not shown) for the impurity implantation is removed according to a conventional process. Thereafter, a thermal treatment is conducted to activate the implanted impurities. Further, a salicide such as $TiSi_2$ is formed as required on the surface of the active region and an interlayer dielectric film 212 is formed on the entire surface of the resulting silicon substrate 201.

Subsequently, as shown in FIG. 5(f), the surface of the interlayer dielectric film 212 is polished and flattened by a CMP method.

According to the above-described method, the dishing and erosion about trenches can be prevented. However, there still remains a problem of dishing in the interlayer dielectric film that, when the interlayer dielectric film 212 is flattened by the CMP method after its deposition, a sparse portion where interconnects do not exist is polished much faster than a dense portion. Such level difference in the interlayer dielectric film generated by varying density of interconnects decreases the depth of focus in later lithography processes for forming contact holes and a wiring layer, and produces variations in the depth of the contact holes. That makes difficult the etching process for forming the contact holes and also impedes the miniaturization of devices.

SUMMARY OF THE INVENTION

The present invention provides a semiconductor device comprising: a semiconductor substrate; a plurality of active regions for forming semiconductor elements, the active regions being formed on the semiconductor substrate; a device isolation region for separating the plural active regions from each other, the device isolation region including a trench region filled with an insulating film and a pseudo active region formed adjacent to the trench region; a wiring layer formed above the semiconductor substrate; and a pseudo conductive film formed on the device isolation region, wherein, if the pseudo conductive film is partially or entirely located under the wiring layer, the pseudo conductive film is formed only on the trench region.

In another aspect, the present invention provides a process for manufacturing a semiconductor device including: a semiconductor substrate of a first conductive type; a plurality of active regions for forming a MOS transistor provided with a gate insulating film, a gate electrode and source/drain regions, the active regions being formed on the semiconductor substrate; a device isolation region for separating the plural active regions from each other, the device isolation region including a trench region filled with an insulating film, and a pseudo active region formed adjacent to the trench region and having a diffusion layer of a second conductivity type on the surface thereof; a wiring layer formed above the semiconductor substrate; and a pseudo conductive film formed on the device isolation region, which is formed only on the trench region if the pseudo conductive film is partially or entirely located under the wiring layer, which process comprises the step of forming the diffusion layer of the second conductivity type on the surface of the pseudo active region simultaneously when the source/drain regions are formed, or which process comprises the step of forming the pseudo conductive film on the device isolation region simultaneously when the gate electrode is formed.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The semiconductor device of the present invention is constituted mainly of a semiconductor substrate, device isolation regions and active regions for forming elements (devices), both the regions being formed on the semiconductor substrate, semiconductor elements such as transistors, and a wiring layer.

In the semiconductor device of the present invention, materials for the semiconductor substrate are not particularly limited. For example, usable are semiconductors such as silicon and germanium, compound semiconductors such as GaAs and InGaAs, and the like, among which a silicon is preferred. Preferably, the semiconductor substrate has a first conductivity type region which may be formed by doping either P-type or N-type impurities. The semiconductor substrate may be entirely of the first conductivity type or may have at least one region of the first conductivity type formed thereon as an impurity diffusion region (well). The concentration of the impurities is not particularly limited as far as it is a usual concentration for doping the impurities into a semiconductor substrate or an impurity diffusion region. For example, the concentration may be $1\times10^{16}$ ions/cm$^3$ to $5\times10^{18}$ ions/cm$^3$.

A plurality of active regions for forming semiconductor devices (elements) are formed on the surface of the semiconductor device of the present invention. The shape, size and position of the active regions are not particularly limited and may be selected as appropriate depending upon the function, application and the like of a semiconductor device to be produced. As semiconductor elements to be formed on the active regions, a variety of elements such as transistors, capacitors and resistances may be mentioned. These elements may be formed singly or as a combination thereof. For example, a DRAM, an SRAM, a memory device such as a FLASH memory and the like may be constructed in addition to a CMOS device.

The device isolation regions are formed on the above-described semiconductor substrate. The device isolation regions are for isolating the plural active regions and are composed of trench regions in which insulating films are buried and pseudo active regions formed adjacent to the trench regions.

The trench regions mean regions in which trenches are formed on the surface of the semiconductor substrate, insulating films are buried in the trenches and usually the surface thereof is flattened. However, in addition to the insulating film, an electrically conductive film such as a metal, polysilicon, silicide or the like film may exist in the trenches provided that the trench regions exhibit a device isolation function. The depth of the trenches may be adjusted so that a sufficient device isolation is ensured depending upon the characteristics of the semiconductor devices formed on the semiconductor substrate. For example, the depth may be 0.2 $\mu$m to 1.0 $\mu$m. The trench regions may be formed by a conventional method for trench isolation. For example, the trench regions are produced by forming an insulating film such as an oxide or nitride film on the semiconductor substrate, forming openings in trench regions-to-be on the insulating film by a photolithography and etching technique, forming trenches having a desired depth and size in the semiconductor substrate at the openings, depositing an insulating film on the semiconductor substrate including the trenches preferably to a thickness larger than that of the trenches, and etching back the insulating film by a CMP method or the like, whereby the insulating film is buried in the trenches. The insulating film buried in the trench regions may have some depressions and projections on its surface. However, the insulating film is preferably buried substantially even with the surface of the active regions for forming devices and/or the surface of pseudo active regions, that is, the insulating film is preferably buried so that the surface of the insulating film, the active regions and the pseudo active regions are on the same plane.

Further, the semiconductor substrate of the semiconductor device according to the present invention has pseudo active regions. The pseudo active regions do not mean regions for forming semiconductor elements as the active regions. Nor do they mean regions for connection to a wiring diffusion layer, the semiconductor substrate and an impurity diffusion layer. They mean regions to allow retention of the device isolation function of the trench regions. The physical construction of the pseudo active regions may be substantially the same as that of usual active regions on which elements are not formed yet. Only one pseudo active region or a plurality of pseudo active regions may be formed in the device isolation region. The shape, size and position of the pseudo active region may be selected as appropriate for retaining the device isolation function of the trench regions. It is noted that preferably the pseudo active region has a region of a second conductive type on its surface. This is because, where the region of the second conductivity type is formed on the substrate of the first conductivity type, a depletion layer extends due to PN junction and a parasitic capacity can be reduced. Here the second conductivity type means N type if the first conductivity type is P type, and it means P type if the first conductivity type is N type. The diffusion layer of the second conductivity type formed in the pseudo active region may be formed in part of the pseudo active region, but is preferably formed in the entire surface of the pseudo active region. The concentration of the impurity may be about $5 \times 10^{19}$ ions/cm$^3$ to about $1 \times 10^{21}$ ions/cm$^3$. Preferably the diffusion layer of the second conductivity type is formed less deep than the bottom of the trench in the trench region. For example, in the case where the trench region is about 0.3 $\mu$m to about 1.0 $\mu$m deep, the diffusion layer of the second conductivity type may be about 0.1 $\mu$m to 0.2 $\mu$m thick.

The semiconductor device of the present invention has a wiring layer above the semiconductor substrate. The wiring layer is usually formed for connection of a element or device to another element or device, a element (device) to a semiconductor substrate or to a wiring diffusion layer, a semiconductor substrate to another semiconductor substrate and a wiring diffusion layer to another wiring diffusion layer. Materials for the wiring layer are not particularly limited provided that they are conductive materials which are usually used for electrodes and wiring. Example thereof include metals such as Al, Cu, Pt, Ti, Ta and W, silicides of such metals, polysilicon and the like. The thickness of the wiring layer may be selected as appropriate depending upon applied voltages on the semiconductor device, the material for the wiring layer and the like.

Further, in the semiconductor device of the present invention, a pseudo conductive film is formed on the device isolation region. Here the pseudo conductive film means a conductive film which does not have an electrical function in circuitry unlike an electrodes and an interconnect. The pseudo conductive film may be formed of a material which is usually used for composing an electrode and an interconnect. Examples thereof include metals such as Al, Cu, Pt, Ti, Ta and W, silicides of such metals, polycide, polysilicon and the like. The thickness of the pseudo conductive layer is not particularly limited, and for example, may be the same as the thickness of a electrode of a element formed on the active region such as a transistor or a capacitor. In the case where a transistor is formed in the active region, the pseudo conductive film is preferably formed of the same material in the same thickness as the gate electrode of the transistor.

The pseudo conductive film may be formed either on the trench region or on the pseudo active region provided that it is located on the device isolation region. Also it may be formed in any shape, any position and any size. However, if part of or all of the pseudo conductive film is arranged under the wiring layer, the entire pseudo conductive film must be formed only on the trench region. That is, the pseudo conductive film is required to be so located not to allow an increase in parasitic capacity caused by the overlapping of the wiring layer. It is noted that only one pseudo conductive film or a plurality of pseudo conductive film may be formed in one device isolation region. The shape of the pseudo conductive film is not particularly limited, and may be in the shape of a rectangular, a rectangular having a bend, a rectangular having a hole, an ellipse, a circle or the like. However, in the case where at least part of the pseudo conductive film overlaps the wiring layer, the shape of the pseudo conductive film is preferably equal to or smaller than the shape of the trench region, and more particularly the shape thereof is sufficiently smaller than that of the trench region so that the pseudo conductive film will not overlap the pseudo active region or the active region even if misalignment occurs. In the case where a plurality of pseudo conductive films are formed on the semiconductor substrate, all the pseudo conductive films have the same shape for facilitating their layout.

The pseudo conductive film is preferably in a floating state or fixed at a given potential. The floating state may easily be provided by placing the pseudo conductive film on the device isolation region. In the case of fixing the pseudo conductive film at the predetermined potential, it is possible to suppress actuation of a parasitic transistor as shield plate device isolation and improve device isolation characteristics. The given potential is not particularly limited and various potential values may be mentioned. For example, if the pseudo conductive film is located in a device isolation region sandwiched between active regions in which NMOSs are formed, the given potential may be a ground potential. If the pseudo conductive film is sandwiched between active regions in which PMOSs are formed, the given potential may be a supply voltage.

If a element is formed on the active region, the pseudo conductive film is preferably located in such a position that the pseudo conductive film is not affected electrically by an electrode composing the element. For example, if the element is a transistor, the pseudo conductive film is preferably located in such a position that it is not affected electrically by a gate electrode which is formed on the active region and extended to the device isolation region (the trench region). More particularly, the pseudo conductive film may be located at a distance of at least about 1.0 $\mu$m to about 5.0 $\mu$m from the transistor (including the active region, the gate electrode and the extension of the gate electrode to the device isolation region), though the distance may be adjusted as appropriate depending on the size of the semiconductor device, the width of the gate electrode, the voltage applied to the gate electrode and the like.

The semiconductor device of the present invention may usually be accomplished by the steps of ① forming a trench region in a semiconductor substrate, ② forming a region of the first conductivity type in the semiconductor substrate, ③ forming a element in an active region, more particularly forming a gate insulating film and a gate electrode and then forming a source/drain region, thereby to form a transistor, and ④ forming an interlayer dielectric film, a contact hall, a metal interconnect and the like on the element. These steps may be carried out by processes usually used in manufacture of semiconductor devices. It is noted that, in these steps, either of the steps of ① forming the trench region and ② forming the first conductivity type region may be conducted first. Further, in the case where a transistor is produced, either an N-type or a P-type transistor and both an N-type and a P-type transistors can be formed in the active regions. Also before, during and after the above-described steps ① to ④, it is possible to add appropriate steps such as the step of forming a different element such as a capacitor, the step of implanting ions for control of threshold voltage of the transistor, the step of forming a sidewall spacer on a sidewall of the gate electrode, the step of forming a lightly doped drain (LDD) region, the step of forming a diffusion layer, the step of forming an interconnect and the like, depending upon a desired use, function, performance and the like of a semiconductor device to be produced.

In the present invention, the pseudo conductive film is preferably formed at the same time as the gate electrode is formed in step ③. If a diffusion layer of the second conductivity type is to be formed on the surface of the pseudo active region, the diffusion layer is preferably formed at the same time as an impurity diffusion layer of the second conductivity type is formed in the active region on the semiconductor substrate. More particularly, in the above step ③, when the source/drain regions are formed in the active region of the semiconductor substrate, the diffusion layer of the second conductivity type is preferably formed on the surface of the pseudo active region with use of an appropriate mask. Alternatively, if an interconnect of a diffusion layer is to be formed in part of the active region in other step than the above steps ① to ④, the diffusion layer of the second conductivity type is preferably formed on the surface of the pseudo active region with use of an appropriate mask when the interconnect of the diffusion layer is formed.

The semiconductor device and the process for manufacturing the device of the present invention are now described by way of example with reference to the accompanying drawings.

Figure 1:
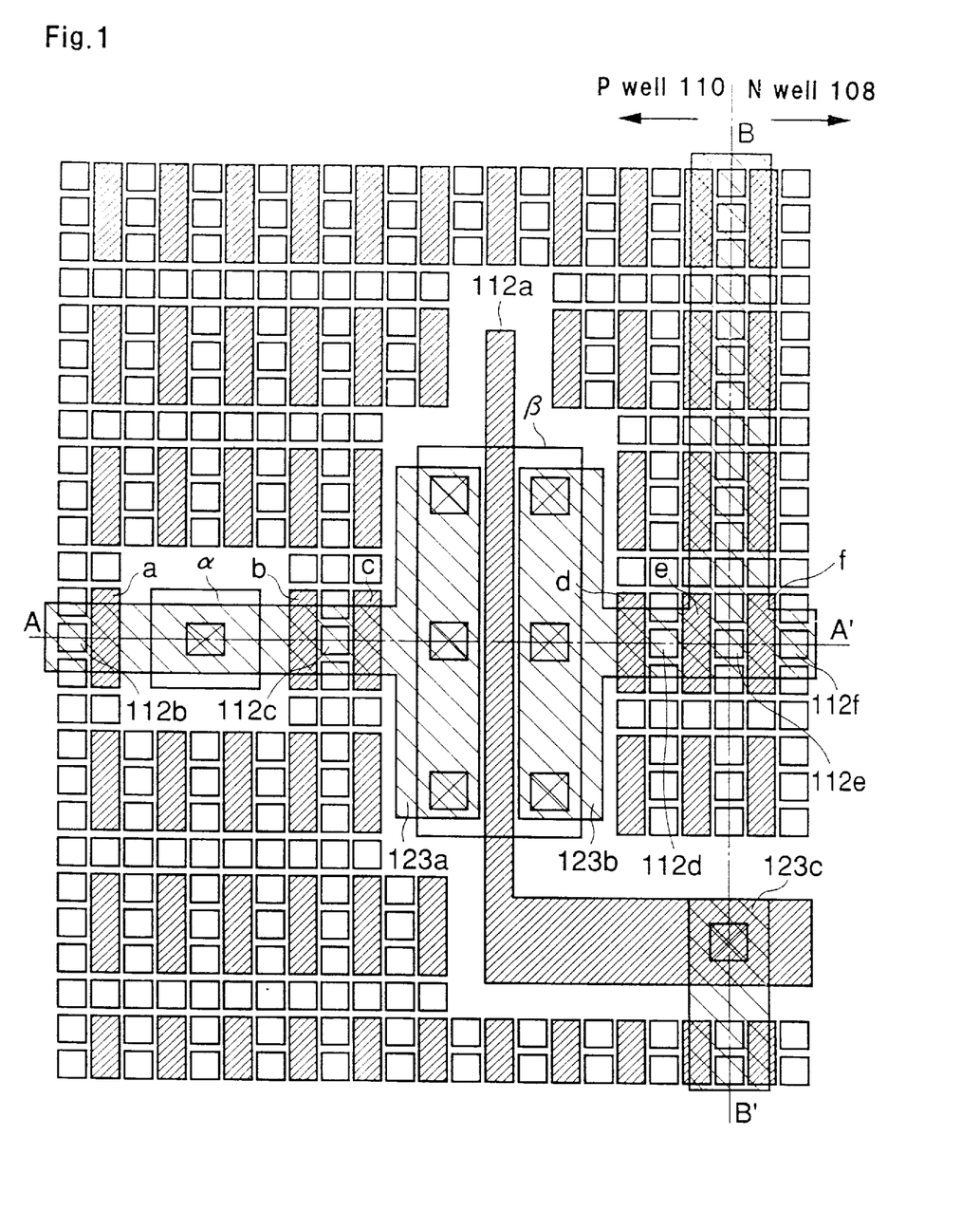
FIG. 1 is a schematic plan view of a major portion illustrating an embodiment of the semiconductor device of the present invention.
Figure 2:
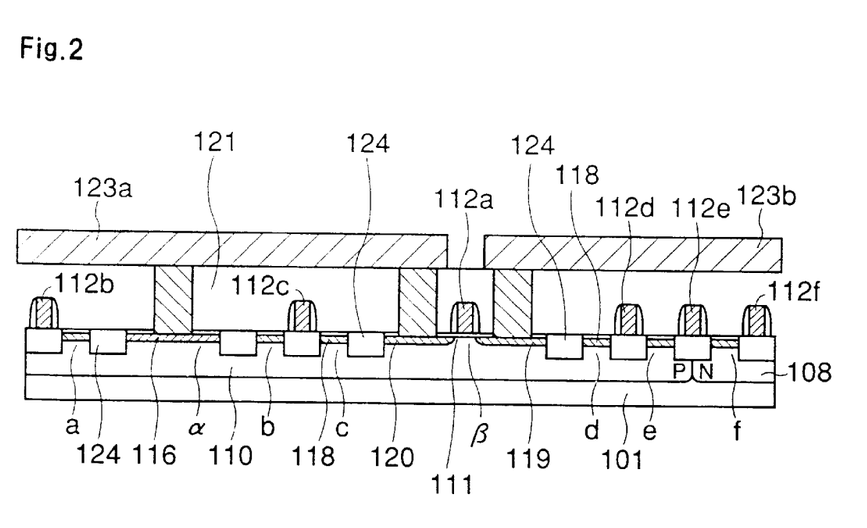
FIG. 2 is a schematic sectional view taken on line A–A' of FIG. 1.
Figure 3:
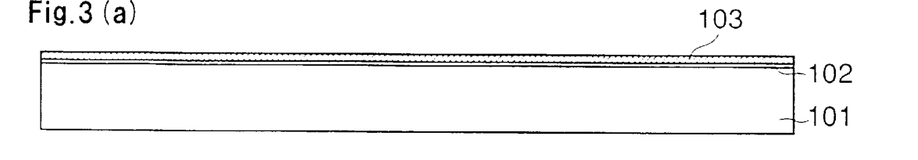
FIGS. 3(a) to 3(f) are schematic sectional views of a major portion illustrating the process for manufacturing a semiconductor device in accordance with the present invention.
Figure 4:
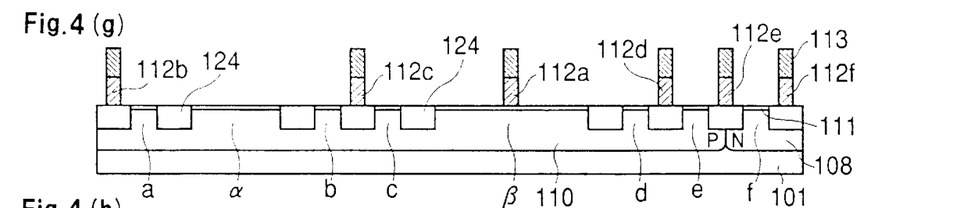
FIGS. 4(g) to 4(l) are schematic sectional views of a major portion illustrating the process for manufacturing a semiconductor device in accordance with the present invention.

As shown in FIGS. 1 and 2, a CMOS inverter, an example of the semiconductor device of the present invention, is so constructed that an NMOS is formed on an active region β surrounded by trench regions 124 in a P-type well 110 formed in a silicon substrate 101 and a PMOS is formed on an active region (not shown) surrounded by trench regions in a N-type well 108 formed in the silicon substrate 101.

The NMOS is constituted of a gate electrode 112a formed on the active region β with intervention of a gate insulating film 111 and source/drain regions 119, 120 formed in the silicon substrate 101 in self-alignment to the gate electrode 112a. The PMOS is also constituted of a gate electrode 112a formed on the active region with intervention of a gate insulating film, and source/drain regions. The gate electrode 112a is formed by a continuous pattern.

The source region 120 of the NMOS is connected to an interconnect 123a provided above the NMOS with intervention of an interlayer dielectric film 121 and is provided with a first reference potential. The interconnect 123a is also used for providing the P-type well 110 with the first reference potential via a P-type diffusion layer 116 formed on the surface of the active region a in the P-type well 110. A like structure is also formed in the PMOS.

The gate electrode 112a of the NMOS is connected to an interconnect 123c which serves as an input line to the CMOS inverter, and the drain region 119 of the NMOS is connected to an interconnect 123b which serves as an output line from the CMOS inverter.

In the P-type well 110 in the CMOS inverter, pseudo active regions a to e in a rectangular shape are formed at spaced intervals in a device isolation region other than the active region β provided with the gate electrode 112a and the active region α. The pseudo active regions a to e have N-type diffusion layers 118 formed on the surface thereof, and a P-type diffusion layer 116 is formed on the surface of a pseudo active region f in the N-type well 108. Thereby PN junction is formed on the surface of the pseudo active regions a to f.

Further, pseudo conductive films 112b to 112f are formed regularly on the trench regions 124.

With this constitution, it is possible to improve flatness when the interlayer dielectric film is polished by CMP and prevent the dishing of the interlayer dielectric film. More particularly, a region having a sparse wiring pattern shows a level difference of about 200 nm on the surface if pseudo conductive films do not exist, while the region provided with a dense wiring pattern by providing the pseudo conductive films shows a reduced level difference of about several tens nm on its surface. As a result, it is possible to improve DOF margin by about 0.2 μm in photolithography technique for providing contact holes and wiring.

Particularly, under the wiring layer, by locating the pseudo conductive film on the trench, interlayer capacity C1 by the interlayer dielectric film between the wiring layer and the pseudo conductive film is connected in series with interlayer capacity C2 by the interlayer dielectric film between the pseudo conductive film and the silicon substrate. That is, the total parasitic capacity $C_{to1}$ between the wiring and the substrate in the trench region is represented by:

$$C_{to1}=(C1 \cdot C2)/(C1+C2) = C1/\{1+(C1/C2)\}.$$

If the thickness T1 of the interlayer dielectric film 121 on the pseudo conductive thin film is 600 nm, the interlayer capacity C1 per unit area between the wiring and the pseudo conductive film is given by $$C1=\epsilon \cdot \epsilon_0/T1=5.75 \text{ nF/cm}^2$$

wherein $\epsilon$ is specific dielectric constant of a silicon oxide film and $\epsilon_o$ is dielectric constant in vacuum.

If the depth T2 of the trench region 124 is 300 nm, the interlayer capacity C2 per unit area between the pseudo conductive film and the silicon substrate is given by $$C2=\epsilon \cdot \epsilon_0/T2=11.5 \text{ nF/cm}^2$$

Therefore, the total parasitic capacitance $C_{to1}$ is calculated to be 3.83 nF/cm².

On the other hand, if the pseudo conductive film is placed on the pseudo active region, capacity C3 per unit area of an oxide film between the pseudo conductive film and the silicon substrate is given by $$C3=\epsilon \cdot \epsilon_o/T3=1151.8 \text{ nF/cm}^2,$$

provided that the thickness T3 of the gate insulating film 111 is 3 nm.

Therefore, the total parasitic capacity $C_{to2}$ is calculated as follows:

$$C_{to2}=(C1 \cdot C3)/(C1+C3)=C1/\{1+(C1/C3)\}=5.72 \text{ nF/cm}_2.$$

Thus, by providing the pseudo conductive film on the trench region as disclosed by the present invention, the total parasitic capacity can be reduced about 33% compared with the case where the pseudo conductive film is mounted on the pseudo active region. That can realize improvement of device characteristics such as speedup of circuitry operation and reduction of power consumption.

The process for manufacturing the above-described semiconductor device is now described with reference to FIGS. 3(a) to 4(l). FIGS. 3(a) to 4(l) show cross-sectional views on line A–A' of FIG. 1.

First, as shown in FIG. 3(a), a pad silicon oxide film 102 is formed to a thickness of 10 to 30 nm on a P-type silicon substrate 101 by thermal oxidation, and then a silicon nitride film 103 is deposited to a thickness of 100 to 250 nm by a LPCVD method.

Nest, as shown in FIG. 3(b), a resist pattern 104 of a desired configuration is formed by a photolithography technique. The resist pattern 104 at this stage is for defining active regions α and β for forming elements and pseudo active regions a, b, c, d and e. By use of the resist pattern 104 as a mask, the silicon nitride film 103 and the silicon oxide film 102 are removed at openings by an RIE method. Then, the silicon substrate 101 is dug 200 to 400 nm to form trenches 105.

Subsequently, as shown in FIG. 3(c), the resist pattern 104 is removed by ashing. Thereafter, silicon oxide thin films (not shown) are formed to a thickness of about 10 to 50 nm in the trenches 105. At this time, silicon oxide thin films are not formed on the active regions α, β and the pseudo active regions a, b, c, d and e since the silicon nitride film 103 which is an oxidation-resistant film exists thereon. Next, a silicon oxide film 106 is deposited to a thickness of 400 to 800 nm by a CVD method or by spin coating method so as to fill the trenches 105 completely. Preferably the thickness of the silicon oxide film 106 is larger than the depth of the trenches 105.

Thereafter, as shown in FIG. 3(d), the silicon oxide film 106 is polished by a CMP method to expose the surface of the silicon nitride film 103 and leave the silicon oxide film 106 only in the trenches 105. Thus trench regions 124 are formed. At this time, the silicon nitride film 103 serves as a stopper to polishing, and the pseudo active regions a to f are arranged in the device isolation region. Accordingly, the dishing and erosion, which are problems specific to the CMP process, are not produced and a very flat surface can be obtained.

Next, as shown in FIG. 3(e), the silicon nitride film 103 is removed by etching with a heated phosphoric acid solution. Thereafter, a resist pattern 107 is formed by a photolithography technique, and then using this pattern as a mask, phosphorus ions are implanted into the silicon substrate 101 twice to four times with varying implantation energy, to form an N-well 108. Here, the N-well 108 must be deeper than the trenches 105, and the ion implantation is preferably performed at an energy of 300 to 600 keV or more at least once. The dose of ions at each implantation is $1 \times 10^{12}$ to $5 \times 10^{13}$ $cm^{-2}$ in accordance with desired PMOS characteristics and N-well resistance.

Subsequently, as shown in FIG. 3(f), the resist pattern 107 is removed by ashing. Thereafter, a resist pattern 109 is formed by a photolithography technique, and then using the pattern as a mask, boron ions are implanted into the silicon substrate 101 twice to four times with varying implantation energy, to form a P-well 110. Here, the P-well 110 must be deeper than the trenches 105, and the ion implantation is preferably performed at an energy of 200 to 400 keV or more at least once. The dose of ions at each implantation is $1 \times 10^{12}$ to $5 \times 10^{13}$ $cm^{-2}$ in accordance with desired NMOS characteristics and P-well resistance.

It is noted that, though the N-well 108 and P-well 110 are formed after the trench regions 124 are formed in the process illustrated in FIG. 3(a) to 3(f), the trench regions 124 may be formed after the wells are formed. Also either of the N-well 108 and the P-well 110 may be formed earlier.

Next, as shown in FIG. 4(g), the resist pattern 109 is removed by ashing. Subsequently, the silicon oxide film 102 is removed by etching with a diluted hydrofluoric acid solution.

Gate insulating films 111 are formed to a thickness of 3 to 10 nm on the active regions α, β and the pseudo active regions a to f. Polysilicon film is deposited to a thickness of 150 to 300 nm by a CVD method and then a gate electrode 112a and pseudo conductive films 112b to 112f are formed by a photolithography and etching technique.

Next, as shown in FIG. 4(h), a resist pattern 113 is removed by ashing. By use of the gate electrode 112a and pseudo conductive films 112b to 112f as masks, ion implantation is carried out for forming an LLD (not shown) on the surface of the silicon substrate 101. Subsequently, a silicon nitride film or silicon oxide film is deposited to a thickness of 50 to 150 nm by a CVD method and etched back by an RIE method, to form spacer insulating films 114 on sidewalls of the gate electrode 112a and the pseudo conductive films 112b to 112f.

As shown in FIG. 4(i), a resist pattern 115 is formed by a photolithography technique to cover all the P-well region 110 except the active region α. By use this resist pattern 115 as a mask, $BF_2$ ions are implanted at an implantation energy of 20 to 60 keV with a dose of 2 to $5 \times 10^{15}/cm^2$, to form a p-type diffusion layer 116 on the surface of the active region α. In the active regions in the W-well 108, source/drain regions (not shown) of PMOS are formed by implanting ions on the surface of the silicon substrate 101 in self-alignment using the gate electrode, the pseudo conductive film 112f and the spacer insulating films 114 as masks.

Subsequently, as shown in FIG. 4(j), a resist pattern 117 is formed by a photolithography technique to cover the active region α in the P-well 110 and the entire N-well region 108 except a part of N-well region (not shown). By use this resist pattern 117 as a mask, As ions are implanted at an implantation energy of 20 to 60 keV with a dose of 2 to $5 \times 10^{15}/cm^2$, to form the N-type diffusion layer 118 on the surface of the pseudo active regions a, b, c, d, e and also to form source/drain regions 119, 120 of NMOS in self-alignment to the gate electrode 112 and the spacer insulating films 114 in the active region β. At this time, an N-type impurity is implanted simultaneously to the gate electrode 112a and the pseudo conductive films 112b to 112e.

Further, as shown in FIG. 4(k), the resist pattern 117 is removed by ashing. Subsequently, the impurities of boron and arsenic doped in the active regions α, β, the pseudo active regions a, b, c, d, e, f, the gate electrode 112a and the pseudo conductive films 112b to 112f are activated by conducting thermal treatment in an oven at 700 to 900° C. for several ten minutes and /or rapid thermal treatment at 1,000 to 1,100° C. for several seconds.

Next, as shown in FIG. 4(l), an interlayer dielectric film 121 are formed in a thickness of 600 to 900 nm by a conventional method and flattened by a CMP method. Further, contact holes are opened, contact plugs 122 are formed by embedding tungsten or the like, and interconnects 123a to 123c are formed of AlCu or the like are formed. A semiconductor device is thus completed.

According to the present invention, the device isolation region includes the trench region filled with an insulating film and the pseudo active region, and the pseudo conductive film, if partially or entirely situated under the wiring layer, is formed only on the trench region. Accordingly, it is possible to prevent the dishing and erosion of the trench region and interlayer dielectric film, which have conventionally been problems, while at the same time the parasitic capacity generated by the overlapping of the wiring layer and pseudo conductive film can be suppressed. Therefore, it is possible to speed up the operation of circuits and reduce power consumption, thereby to improve characteristics of devices.

Also, in the case where the surface of the trench region and that of the pseudo active region are set to be in the same plane, a later photolithography and etching technique can be done with ease and with accuracy.

Further, in the case where the pseudo conductive film is in a floating state, the pseudo conductive film can be formed without being connected to any other interconnect or electrode. This reduces difficulty in designing with regard to the pseudo conductive film and facilitates production.

In the case where the pseudo conductive film is fixed at a predetermined potential, the actuation of a parasitic transistor can be suppressed by allowing the pseudo conductive film to function as a so-called shield plate device isolation. The device isolation characteristics can be improved further.

Further, in the case where the gate electrode is disposed on the active region with intervention of the gate insulating film and the pseudo conductive film is so situated to avoid electrical influence from the gate electrode, the generation of a parasitic capacity between the pseudo conductive film and the wiring layer thereon can be suppressed.

Further, in the case where the gate electrode is disposed on the active region with intervention of the gate insulating film and the pseudo conductive film is formed of the same material as the gate electrode, it is unnecessary to deposit and pattern a conductive film only for forming the pseudo conductive film. This facilitates the formation of the pseudo conductive film and avoids a rise in production cost.

In the case where the pseudo conductive film is divided in plurality within one device isolation region, layout in designing becomes easy. Further where the plural separate pseudo conductive films have the same shape, the layout becomes still easier.

In the case where the semiconductor substrate is of the first conductivity type and the pseudo conductive region has the diffusion layer of the second conductivity type on its surface, PN junction is generated in the pseudo active region and a depletion layer can be formed. Therefore, the parasitic capacity can be reduced more.

Further, according to the process for manufacturing a semiconductor device of the present invention, the above-described semiconductor devices can be manufactured without any addition or change to the conventional process. Thus, the improvement of the performance of semiconductor devices is possible without leading to a rise in production cost.

What is claimed is:

1. A semiconductor device comprising:
   a semiconductor substrate;
   a plurality of active regions for forming semiconductor elements, the active regions being formed on the semiconductor substrate;
   a device isolation region for separating the plural active regions from one another, the device isolation region including a trench region filled with an insulating film, and a pseudo active region formed adjacent to the trench region;
   a wiring layer formed above the semiconductor substrate through the intervention of an interlayer insulating film; and
   a pseudo conductive film formed on the device isolation region for preventing dishing of the interlayer insulating film,
   wherein, when the pseudo conductive film is partially or entirely located under the wiring layer, the entire pseudo conductive film is formed only on the trench region.

2. A semiconductor device according to claim 1, wherein a surface of the trench region and a surface of the pseudo active region are on the same plane.

3. A semiconductor device according to claim 1, wherein the pseudo conductive film is in a floating state.

4. A semiconductor device according to claim 1, wherein the pseudo conductive film is fixed at a predetermined potential.

5. A semiconductor device according to claim 1 further comprising a gate electrode on the active region with intervention of a gate insulating film, wherein the pseudo conductive film is located in such a position that the pseudo conductive film is not electrically affected by the gate electrode.

6. A semiconductor device according to claim 1 further comprising a gate electrode on the active region with intervention of a gate insulating film, wherein the pseudo conductive film is formed of the same material as a material for the gate electrode.

7. A semiconductor device according to claim 1, wherein the pseudo conductive film is divided into two or more.

8. A semiconductor device according to claim 7, wherein the separate pseudo conductive films have the same shape.

9. A semiconductor device according to claim 1, wherein the semiconductor substrate is of a first conductivity type, and the pseudo active region has a diffusion layer of a second conductivity type on the surface thereof.

10. The semiconductor device of claim 1, wherein a plurality of said pseudo conductive films are regularly arranged on respective trench regions.

11. A semiconductor device comprising:
    a semiconductor substrate;
    a plurality of active regions for forming semiconductor elements, the active regions being formed on the semiconductor substrate;
    a device isolation region for separating the plural active regions from one another, the device isolation region including a trench region filled with an insulating film, and a pseudo active region formed adjacent to the trench region;
    a wiring layer formed above the semiconductor substrate through the intervention of an interlayer insulating film, the interlayer insulating film being a dielectric film whose upper surface is flat; and
    a conductive dummy pattern formed on the device isolation region for preventing dishing of the interlayer insulating film, the conductive dummy pattern not having any electrical function in circuitry;
    wherein, when the conductive dummy pattern is partially or entirely located under the wiring layer, the entire conductive dummy pattern is formed only on the trench region.

* * * * *